US011653498B2

(12) United States Patent
Singh et al.

(10) Patent No.: US 11,653,498 B2
(45) Date of Patent: May 16, 2023

(54) MEMORY DEVICE WITH IMPROVED DATA RETENTION

(71) Applicant: Taiwan Semiconductor Manufacturing Co., Ltd., Hsinchu (TW)

(72) Inventors: Gulbagh Singh, Hsinchu (TW); Chen-Hao Li, Kaohsiung (TW); Chih-Ming Lee, Tainan (TW); Chi-Yen Lin, Tainan (TW); Cheng-Tsu Liu, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/035,251

(22) Filed: Jul. 13, 2018

(65) Prior Publication Data

US 2019/0164987 A1 May 30, 2019

Related U.S. Application Data

(63) Continuation of application No. 62/592,904, filed on Nov. 30, 2017.

(51) Int. Cl.
*H01L 27/11568* (2017.01)
*H01L 29/423* (2006.01)
(Continued)

(52) U.S. Cl.
CPC .. *H01L 27/11568* (2013.01); *H01L 29/40117* (2019.08); *H01L 29/42348* (2013.01); *H01L 29/792* (2013.01)

(58) Field of Classification Search
CPC ............. H01L 27/11568; H01L 29/792; H01L 29/40117; H01L 29/42348
See application file for complete search history.

(56) References Cited

U.S. PATENT DOCUMENTS 5,573,965 A   11/1996  Chen et al.
6,806,149 B2 * 10/2004  Bu ...................... H01L 29/7833
                                                                438/301

(Continued)

FOREIGN PATENT DOCUMENTS

CN     1839479 A    9/2006
CN     1998072 A    7/2007
(Continued)

OTHER PUBLICATIONS

Office Action, dated Jul. 30, 2019, for Taiwan Intellectual Property Office Appl. No. 107141864, 4 pages.

*Primary Examiner* — Vongsavanh Sengdara
(74) *Attorney, Agent, or Firm* — Sterne, Kessler, Goldstein & Fox P.L.L.C.

(57) ABSTRACT

The present disclosure relates to a memory device that includes a substrate and source and drain regions formed in the substrate. The memory device includes a gate dielectric formed on the substrate and between the source and drain regions. The memory device also includes a gate structure formed on the gate dielectric and the gate structure has a planar top surface. The memory device further includes a multi-spacer structure that includes first, second, and third spacers. The first spacer is formed on a sidewall of the gate structure and a top surface of one of the source and drain regions. The second spacer is formed on a sidewall of the first spacer and the second spacer has a dielectric constant greater than a dielectric constant of the first spacer. The third spacer is formed on a sidewall of the second spacer and a horizontal surface of the first spacer.

20 Claims, 7 Drawing Sheets

(51) Int. Cl.
  *H01L 21/28* (2006.01)
  *H01L 29/792* (2006.01)

(56) References Cited

U.S. PATENT DOCUMENTS

| | | | |
|---|---|---|---|
| 6,846,716 B2 | 1/2005 | Yeap et al. | |
| 7,511,331 B2 | 3/2009 | Anezaki | |
| 2003/0011017 A1* | 1/2003 | Lee | H01L 29/792 |
| | | | 257/314 |
| 2004/0232477 A1* | 11/2004 | Iwata | H01L 29/7923 |
| | | | 257/E21.21 |
| 2005/0026380 A1* | 2/2005 | Kammler | H01L 29/6659 |
| | | | 438/305 |
| 2005/0112817 A1* | 5/2005 | Cheng | H01L 29/6656 |
| | | | 257/374 |
| 2005/0250287 A1 | 11/2005 | Chen et al. | |
| 2006/0017092 A1* | 1/2006 | Dong | H01L 29/40114 |
| | | | 438/257 |
| 2006/0246641 A1 | 11/2006 | Kammler et al. | |
| 2006/0270165 A1* | 11/2006 | Rho | H01L 29/66272 |
| | | | 257/E21.375 |
| 2007/0128786 A1* | 6/2007 | Cheng | H01L 29/7843 |
| | | | 438/300 |
| 2008/0001191 A1 | 1/2008 | Pruefer et al. | |
| 2008/0067579 A1 | 3/2008 | Lee | |
| 2008/0233691 A1* | 9/2008 | Cheng | H01L 29/66636 |
| | | | 438/197 |
| 2010/0022061 A1* | 1/2010 | Wu | H01L 21/823468 |
| | | | 438/301 |

FOREIGN PATENT DOCUMENTS

| | | |
|---|---|---|
| CN | 101167169 A | 4/2008 |
| JP | 2644414 B2 | 8/1997 |
| KR | 100772106 B1 | 11/2007 |
| KR | 100961404 B1 | 6/2010 |

* cited by examiner

MEMORY DEVICE WITH IMPROVED DATA RETENTION

This application claims the benefit of U.S. Provisional Patent Application No. 62/592,904, titled "Memory Device With Improved Data Retention," which was filed on Nov. 30, 2017 and is incorporated herein by reference in its entirety.

BACKGROUND

Nonvolatile memory is often used in various devices, such as computers. Nonvolatile memory is a type of memory storage that can retain data even while it is not powered on. Examples of nonvolatile memory include flash memory, electrically programmable read-only memory (EPROM), and electrically erasable programmable read-only memory (EEPROM). Functionality of nonvolatile memory includes programming, read, and erase operations.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of illustration and discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features are disposed between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values can be due to slight variations in manufacturing processes or tolerances.

The term "substantially" as used herein indicates the value of a given quantity varies by ±5% of the value.

The term "about" as used herein indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

Nonvolatile memory is a type of memory storage that can retain data even while it is not powered on. Multiple-time programmable (MTP) memory is a type of nonvolatile memory that allows more than one write operation. MTP memory cells may include transistors, capacitors, conductive lines, and other suitable structures. Complementary Metal-Oxide-Semiconductor (CMOS) devices can be used to form MTP memory cells. Fin field-effect transistors (FinFET) and fully-depleted planar silicon-on-insulator (SOI) devices can also be used to form MTP memory cells.

Current leakage and data retention are important design considerations for memory cell structures. Some MTP memory architectures utilize floating gate transistors as storage elements. A lower gate leakage and sub-threshold leakage are desirable for better data retention, reliability, and standby leakage current. In a CMOS MTP device, spacers can be formed on sidewalls of gate structures. Gate leakage through the spacers can however impact data retention performance. In addition, surfaces of the gate structure that are not shielded by the spacers can also contribute to overall gate leakage.

Various embodiments in accordance with this disclosure describe methods of improving data retention in an MTP memory device. A reduction in gate electrode fringing capacitance can improve gate leakage through spacers formed on sidewalls of gate structures. In some embodiments, a multi-layer spacer structure can reduce a spacer dielectric constant and in turn lower the gate electrode fringing capacitance. The multi-layer spacer structure can also reduce a gate overlap capacitance which results in lower gate leakage. Further, the multi-layer spacer structure can also shield the gate structure during further processing (e.g., implantation, etching, and other processes) such that a top surface of the gate structure is substantially planar. The planar top surface can reduce gate leakage and prevent device crosstalk-which in turn enhances data retention in the MTP memory device.

FIGS. 1-6 describe fabrication processes of an exemplary MTP memory device with improved data retention performance, in accordance with various embodiments of the present disclosure.

Figure 1:
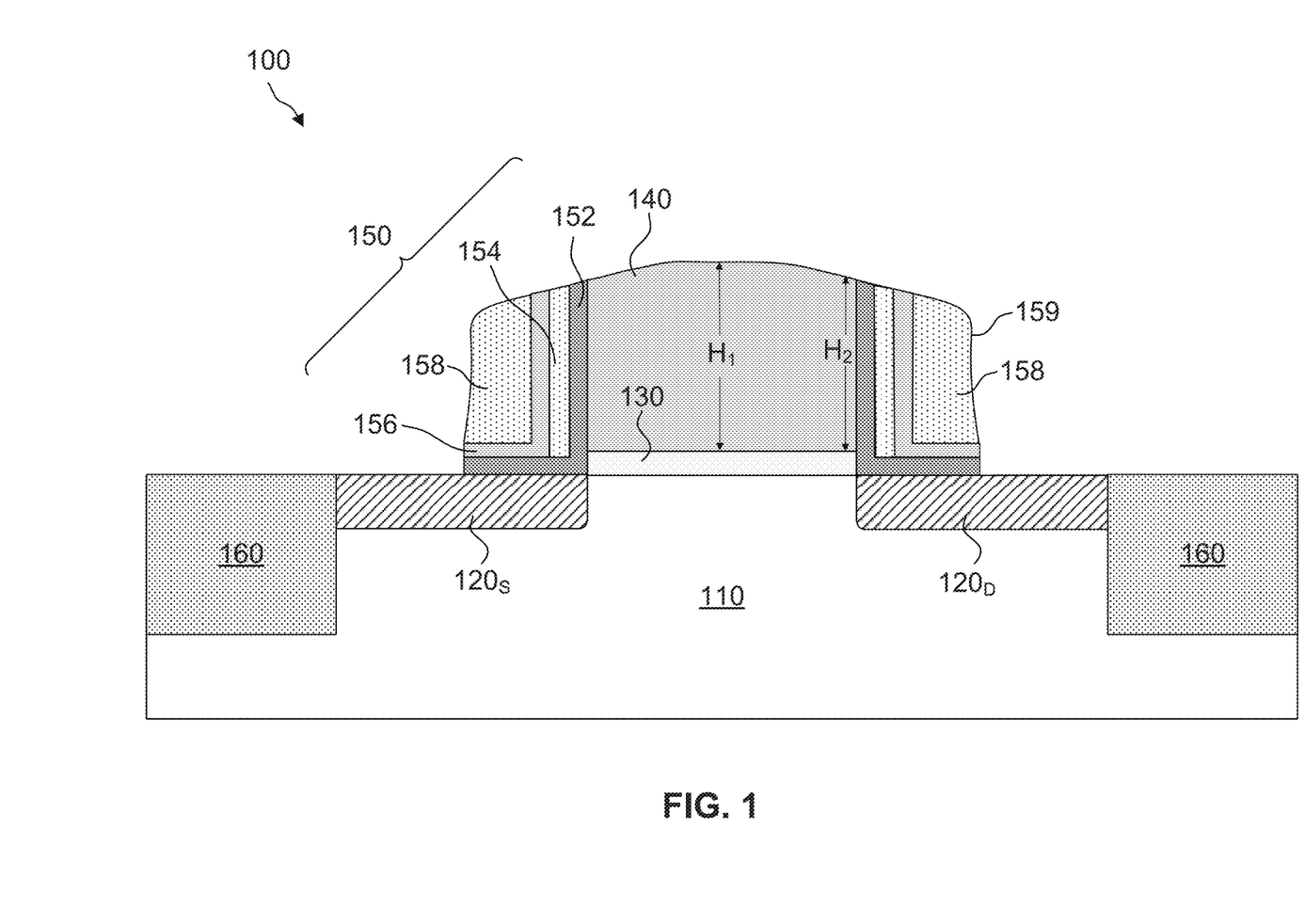
FIG. 1 is a cross-sectional view of an exemplary memory device having a multi-spacer structure, in accordance with some embodiments.

FIG. 1 is a cross-sectional view of an exemplary MTP memory cell, in accordance with some embodiments of the present disclosure. MTP memory cell 100 in FIG. 1 can be formed using a CMOS transistor and includes substrate 110, source and drain regions $120_S$ and $120_D$, gate dielectric 130, gate 140, spacer structure 150, and isolation structures 160. Spacer structure can include a first sub-spacer 152, a second sub-spacer 154, a third sub-spacer 156, and a fourth sub-spacer 158. It should be noted that components of exemplary MTP memory cell 100 are for illustration purposes and are not drawn to scale.

Substrate 110 can be a p-type substrate such as, for example, a silicon material doped with a p-type dopant such as boron. In some embodiments, substrate 110 can be an n-type substrate such as, for example, a silicon material doped with an n-type dopant such as phosphorous or arsenic. In some embodiments, substrate 110 can include, germanium, diamond, a compound semiconductor, an alloy semiconductor, a silicon-on-insulator (SOI) structure, any other suitable material, and/or combinations thereof. For example, the compound semiconductor can include silicon carbide, gallium arsenide, gallium phosphide, indium phosphide, indium arsenide, and/or indium antimonide, and the alloy semiconductor can include SiGe, GaAsP, AlInAs, AlGaAs, GaInAs, GaInP, and/or GaInAsP. Substrate 110 can have a thickness that is in a range from about 100 μm to about 3000 μm.

A pair of source and drain terminals can be formed in substrate 110. For ease of description, a first one of the pair of source and drain terminals is referred to as a source region $120_S$ and a second one of the pair of source and drain terminals is referred to as a drain region $120_D$. The source and drain regions $120_S$ and $120_D$ are interchangeable and are formed in substrate 110. Ion implantation processes are performed on substrate 110 to form source and drain regions $120_S$ and $120_D$ and may utilize any suitable doping species. For example, an n-type doping precursor, e.g., phosphine ($PH_3$) and/or other n-type doping precursors, can be used during the implantation process for the formation of n-type source and drain regions for an n-type transistor device. Source and drain regions $120_S$ and $120_D$ can be an n-type heavily-doped silicon layer that is doped with phosphorus (Si:P). In some embodiments, source and drain regions $120_S$ and $120_D$ can be n-type doped silicon layer that is doped with arsenic. Other types of dopants for forming n-type doped silicon layer may also be included. Source and drain regions $120_S$ and $120_D$ may also be a p-type heavily-doped silicon layer. For example, source and drain regions $120_S$ and $120_D$ may be heavily doped with boron. Other types of dopants for forming p-type doped silicon layer can also be included, such as gallium or indium.

Gate dielectric 130 is formed on substrate 110 and between source and drain regions $120_S$ and $120_D$. Gate dielectric 130 can be formed through a blanket deposition followed by a patterning and etching process. In some embodiments, gate dielectric 130 can be a silicon oxide layer (e.g., silicon dioxide). In some embodiments, gate dielectric 130 can include a high-k material, such as hafnium oxide, lanthanum oxide, aluminum oxide, zirconium oxide, silicon nitride, or other suitable high-k materials. In some embodiments, the dielectric constant of the high-k dielectric layer is higher than about 3.9. Gate dielectric 130 can include a plurality of layers and can be formed using a deposition process such as, for example, chemical vapor deposition (CVD), plasma-enhanced CVD (PECVD), atomic layer deposition (ALD), physical vapor deposition (PVD), any other suitable process, and/or combinations thereof. In some embodiments, the thickness of gate dielectric 130 is between about 2 nm and about 4 nm (e.g., between 2 nm and 4 nm).

An exemplary patterning process for forming gate dielectric 130 can include forming a photoresist layer over a blanket deposited gate dielectric material, exposing the resist to a mask or reticle with a pattern thereon, performing a post-exposure bake process, and developing the resist to form a masking layer. In some embodiments, the masking layer can be a hard mask, such as a silicon nitride layer, any other suitable layer, and/or combinations thereof. Surface areas of gate dielectric material that are not protected by the masking layer are etched using, for example, a reactive ion etching (RIE) processes, a wet etching process, any other suitable process, and/or combinations thereof. After the etching process, gate dielectric 130 is formed on substrate 110 and the masking layer is subsequently removed.

Gate 140 is formed on gate dielectric 130. In some embodiments, gate 140 can be formed using polysilicon or amorphous silicon material. In some embodiments, gate 140 can be a sacrificial gate structure, such as a gate structure in a FinFET replacement gate process used to form a metal gate structure. The replacement gate process and associated manufacturing steps can be performed and are not shown in the figures. The metal gate structure can include barrier layer(s), gate dielectric layer(s), work function layer(s), fill metal layer(s), and/or other suitable materials for the metal gate structure. In some embodiments, the metal gate structure can include capping layers, etch stop layers, and/or other suitable materials. As shown in FIG. 1, in the exemplary MTP device, gate 140 has a substantially planar top surface where a height at the center of gate 140 is about the same as a height of gate 140 measured at its sidewall. For example, gate 140 has a height $H_1$ measured at the center and a height $H_2$ measured at the sidewall, in which the height ratio $H_2/H_1$ can be greater than 0.95.

Multi-spacer structure 150 is formed on the sidewalls of gate 140 and also on source and drain regions $120_S$ and $120_D$. Multi-spacer structure 150 includes respective first, second, third, and fourth sub-spacers 152, 154, 156, and 158. It should be noted that the term "sub-spacer" is used for clarity purposes, and the sub-spacers described here can each be considered as a single spacer or each as a portion of a multi-layer spacer. Multi-spacer structure 150 provides various ways to reduce gate leakage and in turn improve data retention in MTP memory devices. A combination of high-k material for the gate dielectric and a low k dielectric sidewall spacer structure can minimize or suppress the effects of fringing fields. In addition, the low dielectric constant material of the sidewall spacers can also reduce degradation of a threshold voltage of the MTP memory cell.

Sub-spacers can be formed using a deposition and etch-back technique. For example, sub-spacer material layers can be deposited using deposition processes such as, for example, CVD, PECVD, ALD, PVD, any other suitable process, and/or combinations thereof. In some embodiments, sub-spacer material layers can be deposited in two or more steps, where a first step deposits a spacer material layer on the vertical surfaces such as sidewalls and a second step deposits the spacer material layer on horizontal surfaces. After the blanket deposition processes, one or more etch-back processes can be used to remove portions of the blanket sub-spacer material layers. The remaining spacer material layer forms sub-spacers of spacer structure 150 on the sidewalls of gate 140 and top surfaces of source and drain regions $120_S$ and $120_D$. In some embodiments, one or more anisotropic etching processes can be used to form the sub-spacers such that an etching speed is faster in the vertical direction than in the horizontal direction. A horizontal direction can be along a top surface of substrate 110 and a vertical direction can be perpendicular to the top surface. Spacer structure 150 can be formed using a dielectric material, such as silicon oxide, silicon oxynitride, or silicon nitride. In some embodiments, a first dielectric material can be used to form first sub-spacer 152 and a second dielectric material—with a higher dielectric constant than the first dielectric material—can be used to form second sub-spacer 154. For example, first sub-spacer 152 is formed using silicon oxide and second sub-spacer 154 is formed using silicon nitride. Silicon oxide has a dielectric constant of 3.9, and silicon nitride has a higher dielectric constant of 7.5. In some embodiments, third sub-spacer 156 can be formed using silicon oxide. In some embodiments, fourth sub-spacer 158 can be formed using silicon nitride.

Isolation structures 160 can be formed in substrate 110 and between MTP memory devices to avoid crosstalk. For example, isolation structures 160 are formed in substrate 110 and can be made of a dielectric material such as, for example, silicon oxide, spin-on-glass, silicon nitride, silicon oxynitride, fluorine-doped silicate glass (FSG), a low-k dielectric material, any other suitable insulating material, and/or combinations thereof. In some embodiments, isolation structures 106 can be shallow trench isolation (STI) structures formed by etching trenches in substrate 110. The trenches can be filled with insulating material, followed by a chemical-mechanical polishing (CMP) and etch-back process. Other fabrication techniques for isolation structures 160 are possible. Isolation structures 160 can include a multi-layer structure such as, for example, a structure with one or more liner layers. Isolation structures 160 can also be formed by depositing an enhanced gap fill layer to minimize or eliminate voids and seams in the gap fill material.

Gate leakage in MTP memory devices generally occur in three areas. First, top surfaces of gates can be vulnerable to cross talk between gates and adjacent devices, especially if a top surface of the gate is non-planar and protrudes out from the spacers. Portions of the gate not shielded by adjacent spacer structures may not be sufficiently electrically isolated from other devices and the MTP memory device is vulnerable to cross talk to adjacent devices. Second, gate leakage can occur through the gate electrode fringing capacitance, which is a capacitance formed between sidewalls of the gate and corresponding adjacent source or drain region. The gate electrode fringing capacitance can be expressed as:

$$C_{gf} = k_1 \frac{2\beta W}{\pi} \cosh^{-1}\left(\frac{T_{ox} + T_g}{T_{ox}}\right)$$

where $C_{gf}$ is the gate electrode fringing capacitance;
$k_1$ is the dielectric constant of the sidewall spacer structure;
$\beta$ is a form factor added for numerical simulation;
W is a channel width of the CMOS transistor (not shown in FIG. 1);
$T_{ox}$ is a physical thicknesses of the gate dielectric; and
$T_g$ is a physical thicknesses of the gate electrode.

Third, gate leakage can occur through the overlap capacitance or gate dielectric fringing capacitance which is a capacitance formed between the gate and one of the source and drain regions. Gate dielectric fringing capacitance uses portions of the gate dielectric and spacer structure as the capacitor dielectric. For example, the gate dielectric fringing capacitance can be formed by a first capacitor that uses portions of the gate dielectric as its capacitor dielectric and a second capacitor that uses portions of the spacer structure as its capacitor dielectric. The first and second capacitors are connected in series. Therefore, the gate dielectric fringing capacitance can be expressed as:

$$C_{of} = \frac{2\gamma W k_{ox} k_1}{\pi(k_{ox} - k_1)} \ln\left(\frac{k_{ox}}{k_1}\right)$$

where $C_{of}$ is gate dielectric fringing capacitance;
$k_1$ is the dielectric constant of the sidewall spacer structure;
$k_{ox}$ is the dielectric constant of the gate dielectric;
$\gamma$ is a form factor added for numerical simulation; and
W is the channel width of the CMOS transistor (not shown in FIG. 1).

Based on the above equations, in some embodiments, the gate electrode fringing capacitance and the gate dielectric fringing capacitance can be reduced by decreasing the dielectric constant $k_1$ of the sidewall spacer structure.

Gate 140 has a substantially planar top surface after formation of various sub-spacers. In some embodiments, gate 140 has a height at its center that is substantially the same as a height measured at its sidewall. Without gate structure protruding from the adjacent sub-spacer structures, cross talk and gate leakage between gate 140 and adjacent devices can be reduced. As a result, data retention performance is improved.

In some embodiments, by using third sub-spacer 156, the total dielectric constant of the spacer structure can be reduced. Third sub-spacer 156 can be formed using a material having a dielectric constant less than silicon nitride to reduce the overall dielectric constant without changing the overall dimension of the spacer structure in the MTP memory device. For example, third sub-spacer 156 can be formed using an oxygen-based material, such as silicon oxide or silicon dioxide ($SiO_2$). In some embodiments, the silicon oxide layer can be deposited using TEOS as a precursor material. The oxygen-based material can have a dielectric constant approximately equal to 3.9. Because the gate electrode fringing capacitance is directly proportional to the overall dielectric constant of spacer structure, reducing the dielectric constant can reduce the gate electrode fringing capacitance and in turn improve data retention performance. In some embodiments, sidewalls of fourth sub-spacer 158 can be various shapes to accommodate device design needs. For example, as shown in FIG. 1, fourth sub-spacer 158 can have a substantially horizontal top surface and substantially vertical sidewall surface achieved by an etching process with greater etching rate in the vertical direction. In some embodiments, fourth sub-spacer 158 can have a smooth curved top surface achieved by one or more etching process including both anisotropic and isotropic etching processes. An example of a fourth sub-spacer having a smooth curved top surface is described below with reference to FIG. 6.

FIGS. 2-6 illustrate fabrication processes of a partially-fabricated exemplary MTP memory device 200 with a multi-spacer structure, in accordance with some embodiments of the present disclosure. Implementation of the multi-spacer structure provides a reduced spacer dielectric constant and in turn lowers the gate electrode and gate dielectric fringing capacitances. The multi-layer spacer structure also shields the gate structure during further processing (e.g., implantation, etching, and other processes) such that the top surface of the gate structure is substantially planar. The planar top surface of the gate structure can reduce gate leakage and prevent device crosstalk, which in turn enhances data retention in the MTP memory device. In some embodiments, MTP memory device 100 described above in FIG. 1 can also fabricated using the fabrication processes described in FIGS. 2-6.

Figure 2:
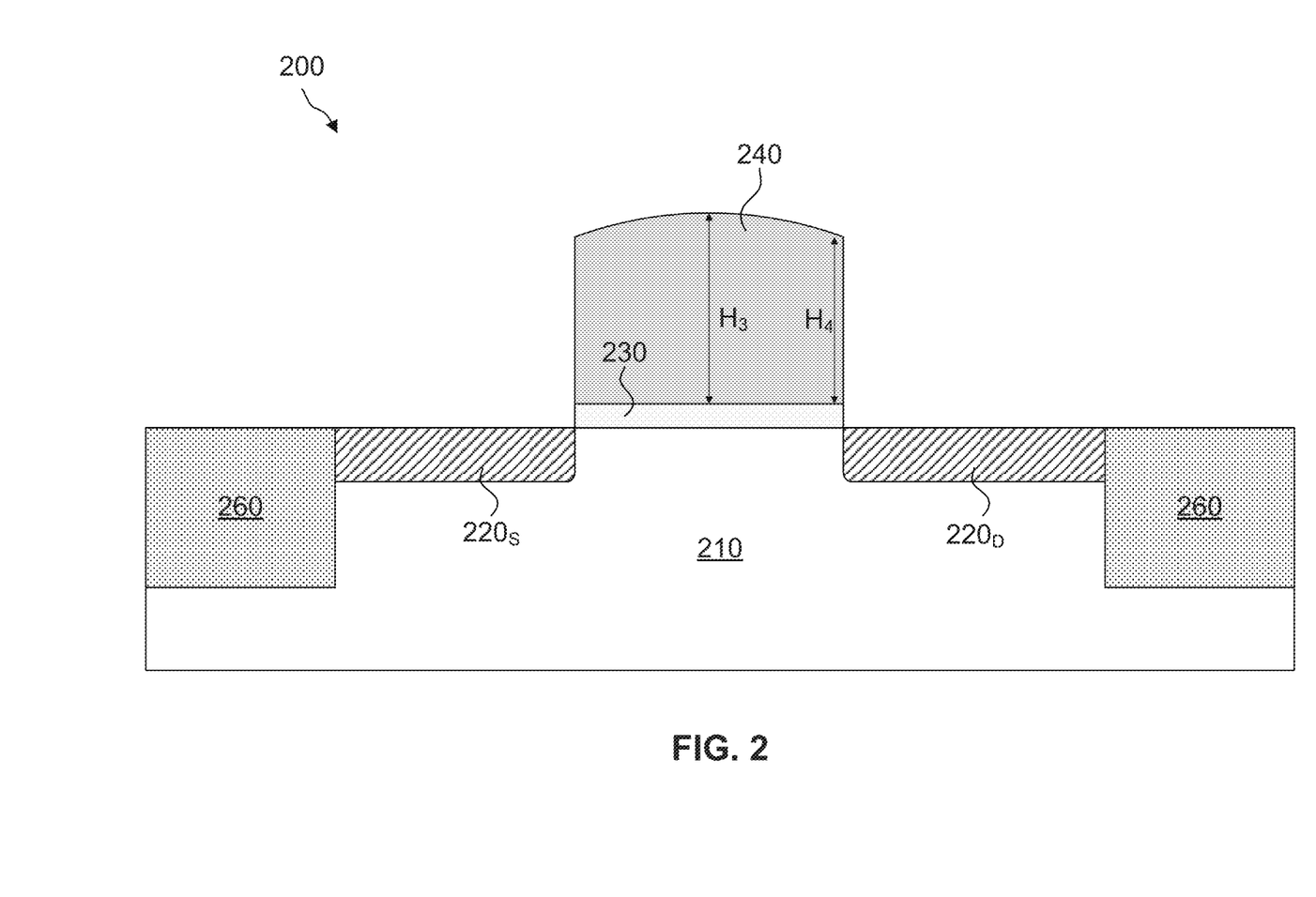
FIGS. 2-6 are cross-sectional views of an exemplary memory device having a multi-spacer structure, in accordance with some embodiments.

FIG. 2 is a cross-sectional view of a partially-fabricated MTP memory device 200 after source and drain regions and gate structures are formed in a semiconductor layer, in accordance with some embodiments of the present disclosure. Partially-fabricated MTP memory device 200 in FIG. 2 includes substrate 210, source and drain regions $220_S$ and $220_D$, gate dielectric 230, gate 240, and isolation structures 260.

Substrate 210 can be similar to substrate 110 as described above in FIG. 1. For example, substrate 210 can be a p-type substrate or an n-type substrate. In some embodiments, substrate 210 can include other suitable materials or structures. Substrate 210 can be prepared for a p-type device or an n-type device.

Source and drain regions $220_S$ and $220_D$ can be similar to source and drain regions $120_S$ and $120_D$ as described above in FIG. 1. In some embodiments, source and drain regions $220_S$ and $220_D$ can be an n-type doped silicon layer or a p-type doped silicon layer.

Gate dielectric 230 can be similar to gate dielectric 130 as described above in FIG. 1. Gate dielectric 230 is formed on substrate 210 and between source and drain regions $220_S$ and $220_D$. Gate dielectric 230 can be formed through a blanket deposition followed by a patterning and etching process. In some embodiments, gate dielectric 230 can be a high-k material, such as hafnium oxide, lanthanum oxide, aluminum oxide, zirconium oxide, silicon nitride, or other suitable high-k materials. In some embodiments, gate dielectric 230 is deposited using a deposition process such as, for example, CVD, PECVD, ALD, PVD, any other suitable process, and/or combinations thereof.

Gate 240 can be similar to gate 140 described above in FIG. 1. Gate 240 is formed on gate dielectric 230. In some embodiments, gate 240 can be formed using polysilicon or amorphous silicon material. In some embodiments, gate 240 can be a sacrificial gate structure used to form a metal gate structure. The metal gate structure can include capping layers, etch stop layers, and/or other suitable materials. As shown in FIG. 2, prior to subsequent processing steps, gate 240 has a substantially planar top surface where the height at the center is substantially the same as the height measured at its sidewall. For example, gate 240 has a height $H_3$ measured at the center and a height $H_4$ measured at the sidewall, and the height ratio $H_4/H_3$ is greater than 0.95 and less than or equal to 1. A greater height ratio of $H_4/H_3$ within the aforementioned ratio provides a more planarized gate top surface and in turn provides reduced cross talk between the gate and adjacent devices.

Figure 3:
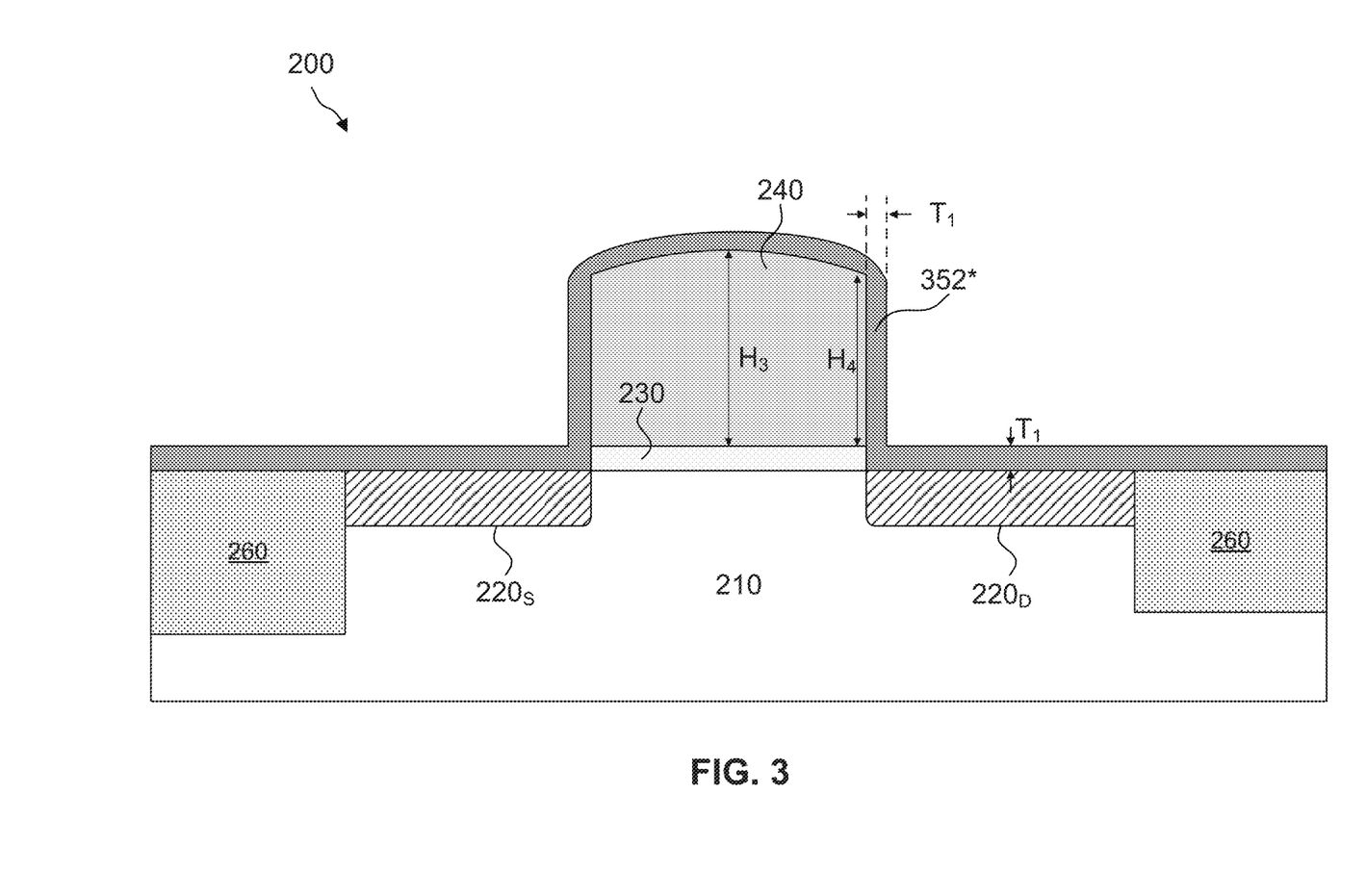

FIG. 3 is a cross-sectional view of a partially-fabricated MTP memory device 200 after a first sub-spacer layer is formed on the sidewalls of the gate and also on the top surfaces of the source and drain regions, in accordance with some embodiments of the present disclosure. Partially-fabricated MTP memory device 200 in FIG. 3 includes substrate 210, source and drain regions $220_S$ and $220_D$, gate dielectric 230, gate 240, a first sub-spacer layer 352*, and isolation structures 260. Merely for explanation purposes, an asterisk is added to numerical labels of the spacer components if a spacer component is a layer of material deposited before patterning/etching processes. For example, first sub-spacer layer 352* represents a layer of material deposited prior to subsequent patterning/etching processes, and first sub-spacer 352 represents the spacer formed after patterning and etching first sub-spacer layer 352*. In some embodiments, an asterisk is added to the numerical label for simplicity and illustration purposes even if the component underwent some patterning and/or etching steps.

First sub-spacer layer 352* is a spacer layer formed on the sidewalls and top surface of gate 240 and also on top surfaces of source and drain regions $220_S$ and $220_D$. First sub-spacer layer 352* is formed using a blanket deposition technique. For example, a spacer material is blanket deposited over the substrate, including gate 240, source and drain regions $220_S$ and $220_D$, and other exposed structures. In some embodiments, first sub-spacer layer 352* is an oxygen-based layer that can be formed of, for example, silicon oxide or silicon dioxide ($SiO_2$). In some embodiments, the silicon oxide layer can be deposited using tetraethyl orthosilicate (TEOS) as a precursor. In some embodiments, first sub-spacer layer 352* can be deposited using a deposition process such as, for example, thermal oxide deposition, wet chemical oxide deposition, CVD, PECVD, ALD, PVD, any other suitable process, and/or combinations thereof. First sub-spacer layer 352* can be a conformal film and have a thickness $T_1$ in a range of 30 Å to about 80 Å (e.g., 30 Å to 80 Å). In some embodiments, first sub-spacer layer 352* has a thickness $T_1$ of about 40 Å. A greater $T_1$ thickness reduces gate dielectric fringing capacitance and in turn provides reduced cross talk between the gate and adjacent devices. However, a greater film thickness also occupies more valuable device space.

Figure 4:
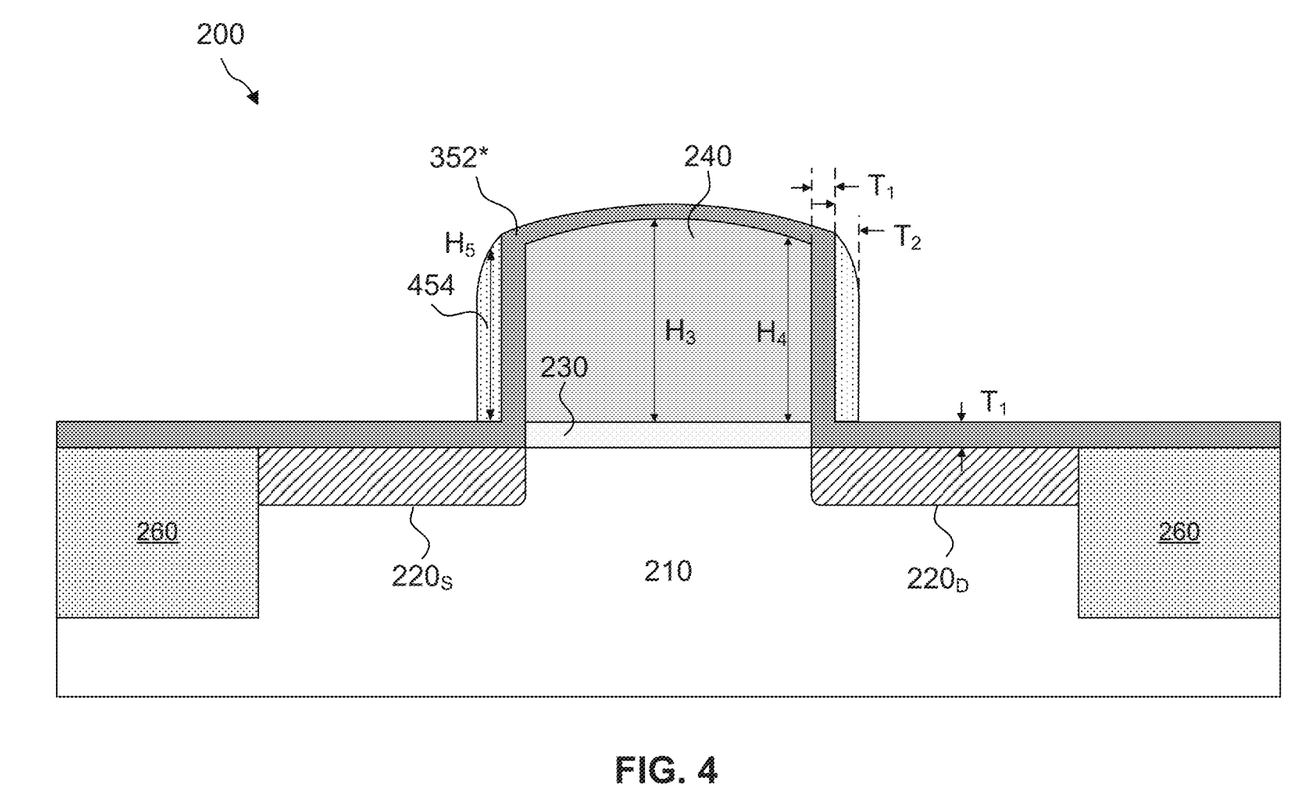

FIG. 4 is a cross-sectional view of a partially-fabricated MTP memory device 200 after a second sub-spacer layer is formed on the first sub-spacer layer, in accordance with some embodiments of the present disclosure. Partially-fabricated MTP memory device 200 in FIG. 4 includes substrate 210, source and drain regions $220_S$ and $220_D$, gate dielectric 230, gate 240, first sub-spacer layer 352*, a second sub-spacer 454, and isolation structures 260.

Second sub-spacer 454 is a spacer layer formed on first sub-spacer layer 352*, including sidewall portions of first sub-spacer layer 352*. The second sub-spacer 454 is formed using a deposition and etch-back technique. For example, a second spacer material is blanket deposited over the substrate, including exposed surfaces of first sub-spacer layer 352* and any other structures. In some embodiments, the second sub-spacer 454 is formed using silicon nitride. In some embodiments, a second sub-spacer layer for forming second sub-spacer 454 can be deposited using a deposition process such as, for example, CVD, PECVD, ALD, PVD, any other suitable process, and/or combinations thereof. After the blanket deposition process, an anisotropic etch-back process is used to remove horizontal portions of the second sub-spacer material to expose portions of first sub-spacer layer 352* that are formed on the top surface of gate 240 and also portions formed on the source and drain regions $220_S$ and $220_D$. The remaining second sub-spacer layer forms second sub-spacer 454 on the sidewalls of first sub-spacer layer 352*. In some embodiments, the anisotropic etch-back process can be a dry etch process that uses chlorine- and/or fluorine-based chemicals. Second sub-spacer 454 can be a conformal film and have a thickness $T_2$ in a range of 50 Å to about 120 Å (e.g., 50 Å to 120 Å). In some embodiments, second sub-spacer 454 has a thickness $T_2$ of about 85 Å. Similar to thickness of $T_1$, a greater $T_2$ thickness reduces gate dielectric fringing capacitance and in turn provides reduced cross talk between the gate and adjacent devices. However, a greater film thickness also occupies more valuable device space. A top surface of gate 240 can be coplanar with the top surface of second sub-spacer 454, because the ratio between a height $H_5$ of second sub-spacer 454 and a height $H_3$ of gate 240 ($H_5/H_3$) can be greater than 0.92 and less or equal to 1. A greater height ratio of $H_5/H_3$ within the aforementioned range can reduce gate electrode fringing capacitance and in turn provides reduced cross talk between the gate and adjacent devices. In some embodiments, a ratio between thicknesses of $T_2$ and $T_1$ can be greater than 0.6 and less or equal to 4. In some embodiments, thickness $T_2$ can be deposited to a sufficient thickness to provide uniform and conformal coverage on sidewalls of first sub-spacer layer 352*.

Figure 5:
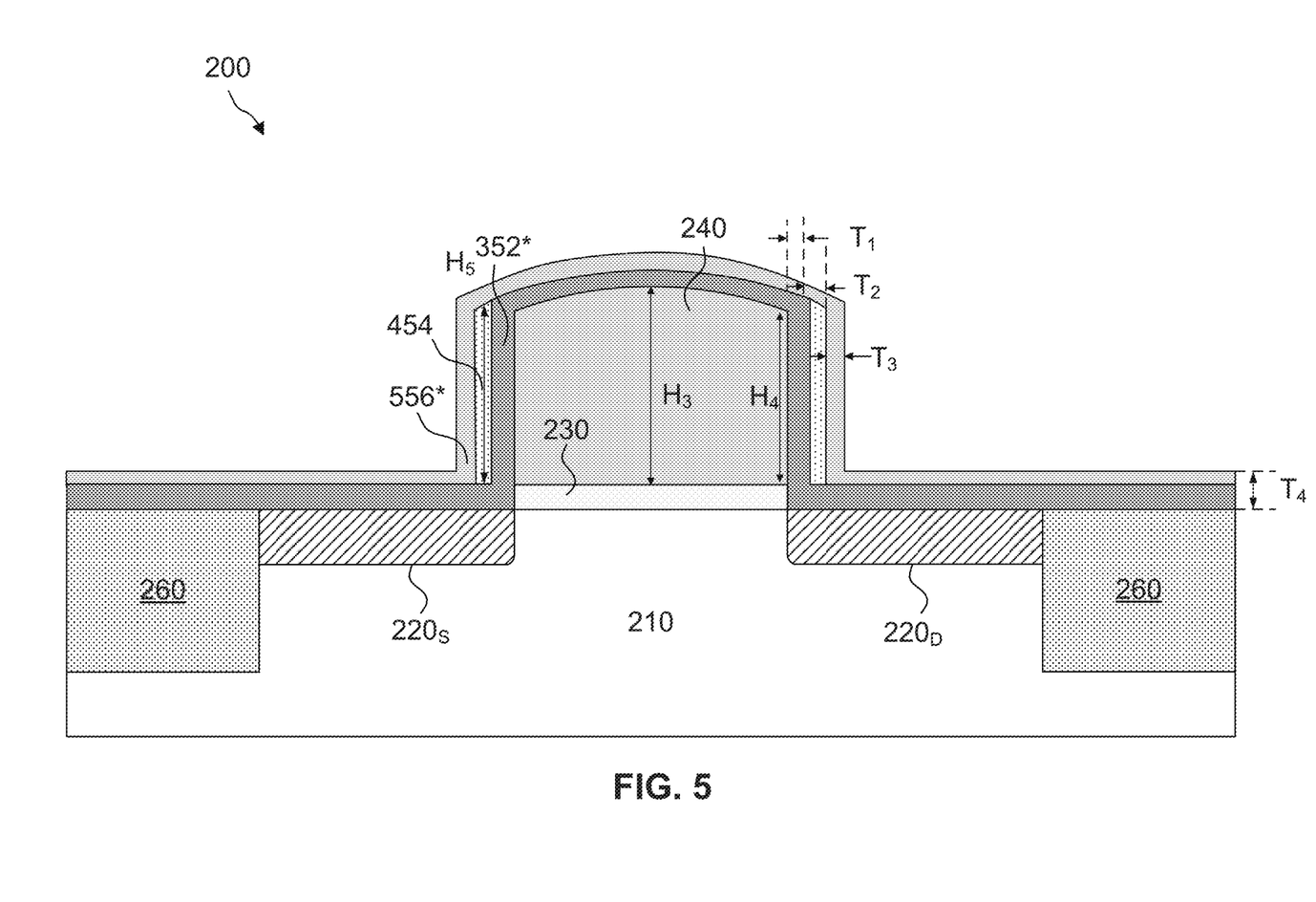

FIG. 5 is a cross-sectional view of a partially-fabricated MTP memory device 200 after a third sub-spacer layer is formed on the first and second sub-spacers, in accordance with some embodiments of the present disclosure. Partially-fabricated MTP memory device 200 in FIG. 5 includes substrate 210, source and drain regions $220_S$ and $220_D$, gate dielectric 230, gate 240, first sub-spacer layer 352*, second sub-spacer 454, a third sub-spacer layer 556*, and isolation structures 260.

Third sub-spacer layer 556* is a spacer layer formed on exposed surfaces of the structure described above in FIG. 4. For example, third sub-spacer layer 556* can be formed on horizontal surfaces of first sub-spacer layer 352* that are over the source and drain regions $220_S$ and $220_D$ and also over gate 240. Third sub-spacer layer 556* can also be formed on exposed sidewalls and top surfaces of second sub-spacer 454. In some embodiments, the third sub-spacer layer 556* can be formed using a blanket deposition technique that is similar to the technique used to form first sub-spacer layer 352*. For example, a third sub-spacer layer can be blanket deposited over the exposed first sub-spacer layer 352* and second sub-spacer 454, and other exposed structures. In some embodiments, the deposition techniques of respective first and third sub-spacer layers 352* and 556* can be different. In some embodiments, the deposition techniques can be the same. In some embodiments, the third sub-spacer layer 556* is an oxygen-based layer that can be formed of, for example, silicon oxide or silicon dioxide ($SiO_2$). In some embodiments, the silicon oxide layer can be deposited using tetraethyl orthosilicate (TEOS). In some embodiments, the third sub-spacer material can be deposited using a deposition process such as, for example, thermal oxide deposition, wet chemical oxide deposition, CVD, PECVD, ALD, PVD, any other suitable process, and/or combinations thereof. Third sub-spacer layer 556* can be a conformal film and have a thickness $T_3$ in a range of 50 Å to about 120 Å (e.g., 50 Å to 120 Å). In some embodiments, third sub-spacer layer 556* has a thickness of about 80 Å. A total thickness $T_4$ of first sub-spacer layer 352* and third sub-spacer layer 556* formed on source and drain regions $220_S$ and $220_D$ can be equal to the sum of thickness $T_3$ of third sub-spacer layer 556* and thickness $T_1$ of first sub-spacer layer 352*. In some embodiments, $T_4$ can be in a range of 80 Å to about 200 Å (e.g., 80 Å to 200 Å). In some embodiments, the thickness $T_3$ of third sub-spacer 556 can be greater or equal to the thickness $T_1$ of first sub-spacer 352. Similar to thickness $T_1$, greater $T_3$ and $T_4$ thicknesses reduce gate dielectric fringing capacitance and in turn provides reduced cross talk between the gate and adjacent devices. However, a greater film thickness also occupies more valuable device space. In some embodiments, a ratio between thicknesses of $T_3$ and $T_2$ can be greater than 0.4 and less or equal to 2.4. In some embodiments, thickness $T_3$ of third sub-spacer layer 556* can be deposited to a sufficient thickness to provide uniform and conformal coverage of exposed horizontal and vertical surfaces of previously-deposited sub-spacer layers.

Figure 6:
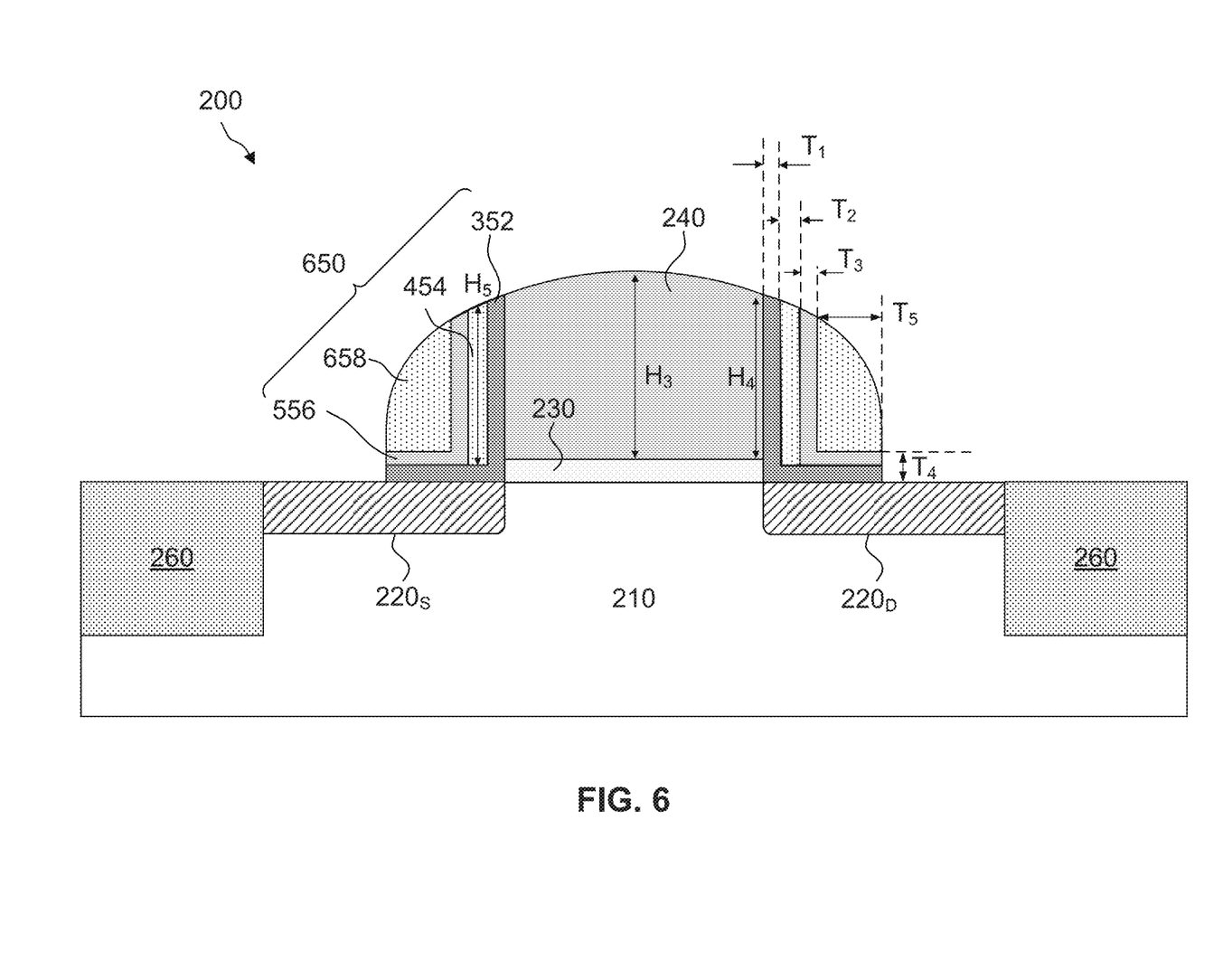

FIG. 6 is a cross-sectional view of a partially-fabricated MTP memory device 200 after a fourth sub-spacer layer is formed on the sidewalls and horizontal surfaces of third sub-spacer 556, in accordance with some embodiments of the present disclosure. Partially-fabricated MTP memory device 200 in FIG. 6 includes substrate 210, source and drain regions $220_S$ and $220_D$, gate dielectric 230, gate 240, first sub-spacer 352, second sub-spacer 454, third sub-spacer 556, a fourth sub-spacer 658, and isolation structures 260.

Fourth sub-spacer 658 is a spacer layer formed on the third sub-spacer 556, including sidewall and horizontal portions of third sub-spacer 556. Similar to second sub-spacer 454, fourth sub-spacer 658 is formed using a deposition and etch-back technique. For example, to form fourth sub-spacer 658, a fourth sub-spacer layer is blanket deposited over the substrate, including at least third sub-spacer 556, gate 240, source and drain regions $220_S$ and $220_D$, and other exposed structures. In some embodiments, the fourth sub-spacer 658 is formed using silicon nitride. In some embodiments, a spacer material can be deposited using a deposition process such as, for example, CVD, PECVD, ALD, PVD, any other suitable process, and/or combinations thereof. After the blanket deposition process, an anisotropic etch-back process is used to remove horizontal portions of the fourth sub-spacer layer and form fourth sub-spacer 658 on the sidewalls and horizontal portions of third sub-spacer layer 556*. During the anisotropic etch-back process of the fourth sub-spacer layer, first sub-spacer layer 352* and second sub-spacer 454 are covered by third sub-spacer layer 556* and protected from the etching process. Therefore, the thickness or height of the deposited first sub-spacer layer 352* and second sub-spacer 454 would not be affected by the anisotropic etching process of fourth sub-spacer layer. In some embodiments, fourth sub-spacer 658 has a thickness $T_5$ in a range of about 240 Å to about 350 Å (e.g., 240 Å to 350 Å). In some embodiments, fourth sub-spacer 658 has a thickness $T_5$ of about 300 Å. In some embodiments, after fourth sub-spacer 658 is formed, portions of respective first and third sub-spacer layers 352* and 556* can be removed using suitable etching processes, exposing portions of the underlying source and drain regions $220_S$ and $220_D$. In some embodiments, one or more etching processes can be used to form fourth sub-spacer 658. The one or more etching processes can include both anisotropic and isotropic etching processes. Depending on the selected etching parameters of the etching processes, sidewall and top surface profiles of fourth sub-spacer 658 can be adjusted based on device needs. For example, fourth sub-spacer 658 can have a substantially horizontal top surface and a substantially vertical sidewall surface, similar to the corresponding surfaces of fourth sub-spacer 158 as illustrated above in FIG. 1. In some embodiments, fourth sub-spacer 658 can have a substantially uniform curved surface (e.g., having similar degrees of curvature at each point on the surface.).

After fourth sub-spacer 658 is formed, etch-back processes are used to remove portions of first and third sub-spacer layers 352* and 556* respectively. In some embodiments, the etch-back processes can be anisotropic etching processes that use chlorine- and/or fluorine-based chemicals, depending on the material being etched. The etch-back processes continue until the top surface of gate 240 is exposed. In some embodiments, the etch-back processes expose a portion of the source and drain regions $220_S$ and $220_D$. As shown in FIG. 6, the remaining first and third sub-spacer layers respectively form first and third sub-spacers 352 and 556.

Sub-spacer thicknesses can vary depending on different device design needs or considerations. In some embodiments, the thickness ratio of fourth sub-spacer 658 over second sub-spacer 454 (i.e., $T_5/T_2$) can be in a range between 3 and 8. In some embodiments, the total thickness of second sub-spacer 454 and fourth sub-spacer 658 (i.e., $T_2+T_5$) over the total thickness of first sub-spacer 352 and third sub-spacer 556 (i.e., $T_1+T_3$) can be in a range between 2 and 12. In some embodiments, the total thickness of the sub-spacers to the left of gate 240 and the total thickness of the sub-spacers to the right of gate 240 can be different or the same. In some embodiments, the total sub-spacer thickness to the left of gate 240 can be within 5-10% of the total sub-spacer thickness to the right of gate 240. In some embodiments, portions of a sub-spacer on one side of gate 240 can have a different thickness than portions of the corresponding sub-spacer formed on the other side of gate 240. For example, one or more sub-spacers can have different thicknesses on the left and right sides of gate 240. FIG. 6 shows four layers of sub-spacers formed on each side of gate 240. In some embodiments, more sub-spacers can be formed if needed. For example, more than two silicon nitride sub-spacers and/or more than two silicon oxide sub-spacers can be formed.

In referring to FIG. 6, a multi-spacer structure 650 includes respective first, second, third, and fourth sub-spacers 352, 454, 556, and 658. It should be noted that the term "sub-spacer" is used for clarity purposes, and the sub-spacers described here can each be considered as a single spacer or each as a portion of a multi-layer spacer. Multi-spacer structure 650 provides various ways to reduce gate leakage and in turn improve data retention in MTP memory devices. A combination of high-k material for the gate dielectric and a low k dielectric sidewall spacer structure can minimize or suppress the effects of fringing fields. In addition, the low dielectric constant material of the sidewall spacers can also reduce degradation of a threshold voltage of the MTP memory cell.

As shown in FIG. 6, gate 240 has a substantially planar top surface after the processing of various spacer materials and other processes. In some embodiments, the top surface of gate 240 is protected by at least the first sub-spacer layer 352* during the subsequent processing of respective second, third, and fourth sub-spacers 454, 556, and 658. For example, after the blanket deposition of first sub-spacer layer 352*, top surface of gate 240 is protected from subsequent processing steps, such as plasma processes, wet chemical processes, dry etching processes, ion implantation processes, etc. Therefore, the height and cross-sectional profile of gate 240 remain substantially the same after various processes, and the top portion of gate 240 can be shielded without protruding out from the spacer structures. Gate 240 has a substantially planar top surface where the height at the center is substantially the same as the height measured at the sidewall. For example, gate 240 has a height $H_3$ measured at the center and $H_4$ measured at the sidewall, and the height ratio $H_4/H_3$ is greater than 0.95 and less or equal to 1. In addition, second spacer 454 is protected by third spacer material 556* during the deposition and etching of fourth spacer 658. Therefore, the height and cross-sectional profile of second spacer 454 remain substantially the same after the fourth spacer 658 is formed. Without protruding from the spacer structures, cross talk between gate 240 and adjacent devices is reduced and gate leakage is reduced. As a result, data retention performance is improved.

In some embodiments, by using third sub-spacer 556, the total dielectric constant of the spacer structure can be reduced. For example, the structure illustrated in FIG. 1 uses silicon nitride as the spacer material on first sub-spacer 152. As mentioned above, silicon nitride has a dielectric constant of 7.5. Third sub-spacer 556 can be formed using a material having a dielectric constant less than silicon nitride to reduce the overall dielectric constant without changing the overall dimension of the spacer structure in the MTP memory device. For example, third sub-spacer 556 can be formed using an oxygen-based material, such as silicon oxide or silicon dioxide ($SiO_2$). In some embodiments, the silicon oxide layer can be deposited using TEOS as a precursor material. The oxygen based material can have a dielectric constant approximately equal to 3.9. Because the gate electrode fringing capacitance is directly proportional to the overall dielectric constant of spacer structure, reducing the dielectric constant can reduce the gate electrode fringing capacitance and in turn improve data retention performance.

Further, in addition to forming the third sub-spacer 556 on the vertical sidewalls of second sub-spacer 454, the third sub-spacer 556 is also formed on the horizontal surface of first sub-spacer 352. Therefore, third sub-spacer 556 which has a lower dielectric constant, is formed between gate 240 and one or both of the source and drain regions $220_S$ and $220_D$. As discussed above, gate leakage can occur through the gate dielectric fringing capacitance which is a capacitance related to a spacer dielectric constant and formed between gate 140 and source and drain region $120_S$ and $120_D$. By incorporating the third sub-spacer 556 with a lower dielectric constant, gate dielectric fringing capacitance can be reduced. Therefore, gate leakage between the gate structure and the source and drain regions can also be reduced and in turn provides an improved data retention performance.

Figure 7:
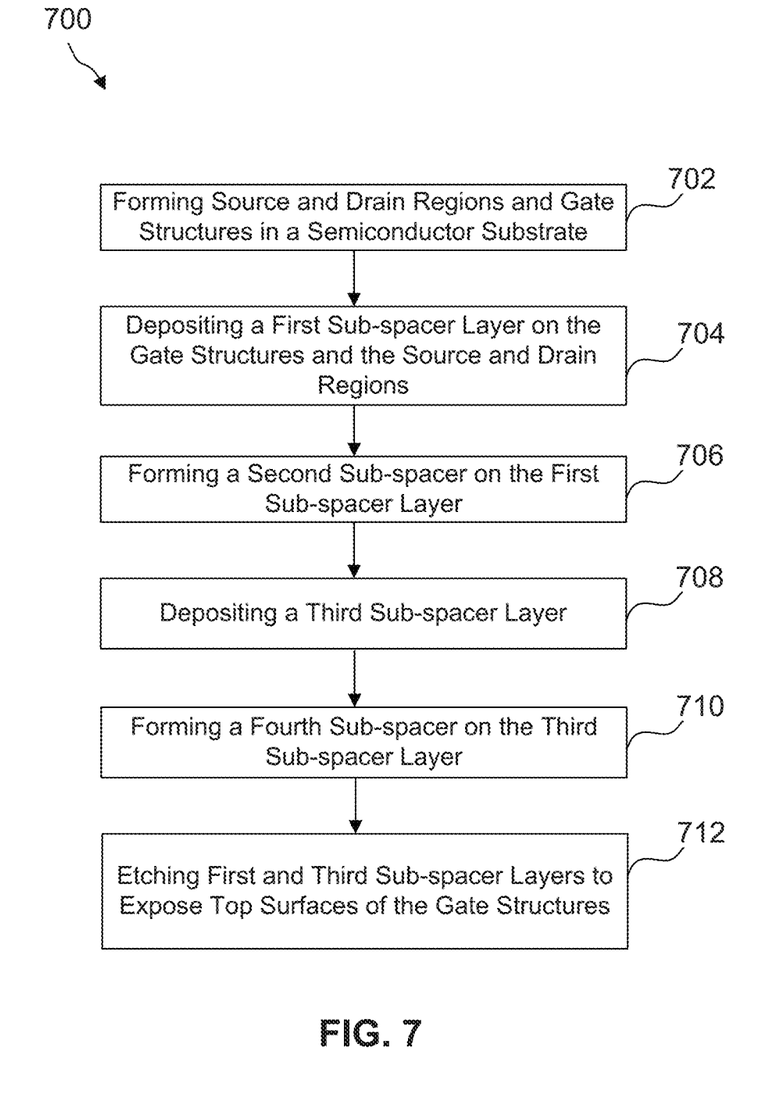
FIG. 7 is a flow diagram of an exemplary method for forming a multi-spacer memory device, in accordance with some embodiments.

FIG. 7 is a flow diagram of an example method 700 for forming an MTP memory device having a multi-spacer structure, in accordance with some embodiments of the present disclosure. Other operations in method 700 can be performed and operations of method 700 can be performed in a different order and/or vary.

At operation 702, source and drain regions and gate structures are formed in a semiconductor substrate, in accordance with some embodiments of the present disclosure. Semiconductor substrate can be a p-type substrate or an n-type substrate. In some embodiments, semiconductor substrate can include other suitable materials or structures. In some embodiments, the source and drain regions can be an n-type doped silicon layer or a p-type doped silicon layer.

A gate dielectric is formed on the semiconductor substrate and between the source and drain regions. The gate dielectric can be formed through a blanket deposition followed by a patterning and etching process. In some embodiments, the gate dielectric can be a high-k material. A gate is formed on the gate dielectric. In some embodiments, the gate can be formed using polysilicon or amorphous silicon material. In some embodiments, the gate can be a sacrificial gate structure used to form a metal gate structure. The gate has a substantially planar top surface where a height at the center is substantially the same as a height measured at the sidewall. The height ratio between the heights measured respectively at the sidewall and the center is greater than 0.95 and less or equal to 1. Examples of the semiconductor substrate, the source and drain regions, the gate dielectric, and gate can be substrate 210, source and drain regions $220_S$ and $220_D$, gate dielectric 230, and gate 240, respectively, as described above with reference to FIG. 2.

At operation 704, a first sub-spacer layer is blanket deposited on the exposed surfaces of the gate structures and also on the source and drain regions, in accordance with some embodiments of the present disclosure. The first sub-spacer layer is formed on the gate sidewalls and the top surface. The first sub-spacer layer is also deposited on top surfaces of the source and drain regions. The first sub-spacer layer is formed using suitable deposition techniques. In some embodiments, the first sub-spacer layer can be an oxygen-based layer that is formed using tetraethyl orthosilicate (TEOS) as a precursor. In some embodiments, the first sub-spacer layer can be formed using silicon oxide or silicon dioxide ($SiO_2$). The first sub-spacer layer can be a conformal film with a thickness in a range of 30 Å to about 50 Å (e.g., 30 Å to 50 Å). In some embodiments, the first sub-spacer layer has a thickness of about 40 Å. An example of the first sub-spacer layer can be first sub-spacer layer 352* described above with reference to FIG. 3.

At operation 706, a second sub-spacer is formed on the sidewalls of the first sub-spacer layer, in accordance with some embodiments of the present disclosure. The second sub-spacer is formed on the first sub-spacer layer including sidewall portions of the first sub-spacer layer. In some embodiments, the second sub-spacer is formed using silicon nitride. The second sub-spacer can be a conformal film with a thickness in a range of 70 Å to about 100 Å (e.g., 70 Å to 100 Å). In some embodiments, the second sub-spacer has a thickness of about 85 Å. The top surface of the gate can be coplanar with the top surface of the second sub-spacer, because the ratio between a center height of the gate and the height of second sub-spacer is greater than 0.92 and less or equal to 1. An example of the second sub-spacer can be second sub-spacer 454 described above with reference to FIG. 4.

At operation 708, a third sub-spacer layer is deposited on the first sub-spacer layer and the second sub-spacer. In some embodiments, the third sub-spacer layer is an oxygen-based material that can be formed of, for example, silicon oxide or silicon dioxide ($SiO_2$). In some embodiments, the silicon oxide layer can be deposited using tetraethyl orthosilicate (TEOS). The third sub-spacer layer can form a conformal film with a thickness in a range of 65 Å to about 95 Å (e.g., 65 Å to 95 Å). In some embodiments, the third sub-spacer layer has a thickness of about 85 Å. The total thickness of the first sub-spacer layer and the third sub-spacer layer formed on the source and drain regions can be in a range of 95 Å to about 145 Å (e.g., 95 Å to 145 Å). An example of the third sub-spacer layer is third sub-spacer layer 556* described above with reference to FIG. 5.

At operation 710, a fourth sub-spacer is formed on the third sub-spacer layer. The fourth sub-spacer is formed on the third sub-spacer layer, including the sidewall and horizontal portions of the third sub-spacer layer. In some embodiments, the fourth sub-spacer is formed using silicon nitride. In some embodiments, the fourth sub-spacer has a thickness in a range of about 240 Å to about 360 Å (e.g., 240 Å to 360 Å). In some embodiments, the fourth sub-spacer has a thickness of about 300 Å. An example of the fourth sub-spacer is fourth sub-spacer 658 described above with reference to FIG. 6.

At operation 712, first and third sub-spacer layers are etched to expose top surfaces of the gate structures and form first and third sub-spacers, respectively. For example, suitable etch-back processes can be used to remove portions of the first and third sub-spacer layers. In some embodiments, the etch-back processes can include anisotropic etching processes. The etch-back processes continues until the top surface of gate 240 is exposed. In some embodiments, the etch-back processes can expose portions of the source and drain regions. The fourth sub-spacer has thickness sufficient to cover horizontal portions of the first and third sub-spacers (e.g., completely cover the horizontal portions of the third sub-spacer layer). An example of first and third sub-spacers are first and third sub-spacers 352 and 556 as shown in FIG. 6.

Various embodiments in accordance with this disclosure describes methods of improving data retention in an MTP memory device. A reduction in gate electrode fringing capacitance can decrease gate leakage through the spacers. Implementation of a multi-layer spacer structure provides reduced spacer dielectric constant and in turn lowers the gate electrode fringing capacitance. The multi-layer spacer structure also reduces the gate overlap capacitance or gate dielectric capacitance which results in lower gate leakage. The multi-layer spacer also shields the gate structure during further processing (e.g., implantation, etching, and other processes) such that the top surface of the gate structure is substantially planar. The planar top surface rather than a protruding top surface reduces gate leakage and prevents device crosstalk which in turn enhances data retention in an MTP memory device.

In some embodiments, a memory device includes a substrate and source and drain regions formed in the substrate. The memory device also includes a gate dielectric formed on the substrate and between the source and drain regions. The memory device also includes a gate structure formed on the gate dielectric and the gate structure has a planar top surface. The memory device further includes a multi-spacer structure that includes first, second, and third spacers. The first spacer is formed on a sidewall of the gate structure and a top surface of one of the source and drain regions. The second spacer is formed on a sidewall of the first spacer and the second spacer has dielectric constant greater than a dielectric constant of the first spacer. The third spacer is formed on a sidewall of the second spacer and a horizontal surface of the first spacer.

In some embodiments, a multiple-time programmable (MTP) memory device includes a substrate and a source region formed in the substrate. The source region includes a top surface. The MTP memory device also includes a gate dielectric formed on the substrate and a gate structure formed on the gate dielectric. The gate structure includes a sidewall. The MTP memory device also includes first, second, third, and fourth spacers. The first spacer is formed on the sidewall of the gate structure and the top surface of the source region. The second spacer is formed on a sidewall of the first spacer. The third spacer is formed on the first spacer and in contact with the second spacer. The fourth spacer is formed on the third spacer.

In some embodiments, a method for forming a memory device includes providing a substrate and forming source and drain regions in the substrate. The method also includes forming a gate dielectric on the substrate and forming a gate structure on the gate dielectric. The gate structure includes a sidewall. The method further includes depositing a first sub-spacer layer and forming a second sub-spacer on the first sub-spacer layer. A third sub-spacer layer is deposited. The method also includes forming a fourth sub-spacer on the third sub-spacer layer. The method further includes etching the third sub-spacer layer to form a third sub-spacer on the first sub-spacer layer and the second sub-spacer. The first sub-spacer layer is etched to form a first sub-spacer on the sidewall of the gate structure and on the source and drain regions.

It is to be appreciated that the Detailed Description section, and not the Abstract of the Disclosure, is intended to be used to interpret the claims. The Abstract of the Disclosure section may set forth one or more but not all exemplary embodiments contemplated and thus, are not intended to be limiting to the subjoined claims.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the subjoined claims.

What is claimed is:

1. A semiconductor device, comprising:
   a substrate;
   source and drain regions formed in the substrate;
   a gate dielectric formed on the substrate and between the source and drain regions;
   a gate structure formed on the gate dielectric, wherein the gate structure has a substantially planar top surface; and
   a multi-spacer structure comprising first and second multi-spacers respectively formed on a pair of opposing sidewalls of the gate structure, wherein each of the first and second multi-spacers comprises:
      a first spacer, comprising an L-shaped cross-sectional profile, in direct contact with a sidewall of the pair of opposing sidewalls of the gate structure and in direct contact with a top surface of one of the source and drain regions;
      a second spacer, comprising an I-shaped cross-sectional profile, in direct contact with a sidewall of the first spacer, wherein the second spacer comprises a dielectric constant greater than a dielectric constant of the first spacer; and
      a third spacer, comprising an L-shaped cross-sectional profile, in direct contact with a sidewall of the second spacer and in direct contact with a horizontal surface of the first spacer, wherein:
         a topmost surface of the third spacer is below a topmost surface of the first spacer;
         a bottom surface of the third spacer is coplanar with a bottom surface of the second spacer;
         the third spacer is separated from the source and drain regions by the first spacer; and
         the third spacer comprises at least a pair of substantially planar horizontal surfaces,
      wherein a sum of thicknesses, along horizontal directions, of vertical portions of the first and third spacers is equal to a sum of thicknesses, along vertical directions, of horizontal portions of the first and third spacers.

2. The semiconductor device of claim 1, wherein the first spacer comprises silicon oxide.

3. The semiconductor device of claim 1, wherein the second spacer comprises silicon nitride.

4. The semiconductor device of claim 1, wherein the gate structure has a first height measured at a center of the gate structure and the second spacer has a second height, and wherein a ratio of the second height to the first height is greater than 0.92 and less than 1.

5. The semiconductor device of claim 1, wherein the multi-spacer structure further comprises a fourth spacer formed on the third spacer, and wherein the fourth spacer comprises a dielectric constant greater than the dielectric constant of the third spacer.

6. The semiconductor device of claim 1, wherein the third spacer comprises:
   a first portion extending in a horizontal direction and comprising a substantially uniform thickness; and
   a second portion extending in a vertical direction and comprising a substantially uniform width.

7. The semiconductor device of claim 1, wherein the first spacer is a single continuous structure without an internal interface.

8. The semiconductor device of claim 1, wherein the topmost surface of the third spacer is below a topmost surface of the second spacer.

9. A memory device, comprising:
   a substrate;
   a source region and a drain region formed in the substrate, wherein each of the source region and drain region comprises a top surface;
   a gate dielectric formed on the substrate;
   a gate structure formed on the gate dielectric, wherein the gate structure comprises a pair of opposing sidewalls;
   a multi-spacer structure comprising first and second multi-spacers respectively formed on the pair of opposing sidewalls of the gate structure, wherein each of the first and second multi-spacers comprises:
      a first spacer comprising a first L-shaped structure, wherein the first spacer is in direct contact with a sidewall of the pair of opposing sidewalls of the gate structure and in direct contact with the top surface of the source region or the drain region;
      a second spacer comprising an I-shaped structure, wherein the second spacer comprises a dielectric material and is in direct contact with a sidewall of the first spacer;
      a third spacer in direct contact with the first and second spacers, wherein the third spacer comprises:
         a second L-shaped structure, wherein a vertical portion of the second L-shaped structure comprises a pair of substantially planar sidewalls, wherein a topmost surface of the vertical portion of the third spacer is below a topmost surface of the first spacer, and wherein a bottom surface of a horizontal portion of the second L-shaped structure is coplanar with a bottom surface of the second spacer and
         an other dielectric material that is different from the dielectric material; and
      a fourth spacer formed on the third spacer.

10. The memory device of claim 9, wherein the third spacer comprises silicon oxide.

11. The memory device of claim 9, wherein the fourth spacer comprises silicon nitride.

12. The memory device of claim 9, wherein a horizontal portion of the third spacer comprises a substantially uniform thickness.

13. The memory device of claim 9, wherein the first L-shaped structure is a single continuous structure without an internal interface.

14. A memory device, comprising:
   a substrate;
   a source region and a drain region formed in the substrate, wherein each of the source region and drain region comprises a top surface;
   a gate dielectric formed on the substrate;

a gate structure formed on the gate dielectric, wherein the gate structure comprises a pair of opposing sidewalls;

a multi-spacer structure comprising first and second multi-spacers respectively formed on the pair of opposing sidewalls of the gate structure, wherein each of the first and second multi-spacers comprises:

a first spacer comprising:
  an L-shaped cross-sectional profile;
  a first portion in direct contact with a sidewall of the pair of opposing sidewalls of the gate structure; and
  a second portion in direct contact with the top surface of the source region or the drain region;

a second spacer, comprising an I-shaped cross-sectional profile, in direct contact with a sidewall of the first portion of the first spacer;

a third spacer comprising:
  an L-shaped cross-sectional profile;
  a first portion comprising a substantially uniform thickness, wherein the first portion extends in a horizontal direction and is separated from the source region or the drain region by the second portion of the first spacer and wherein a bottom surface of the first portion is coplanar with a bottom surface of the second spacer; and
  a second portion comprising a substantially uniform width, wherein the second portion extends in a vertical direction and is in direct contact with a sidewall of the second spacer, wherein a topmost surface of the second portion of the third spacer is below a topmost surface of the first portion of the first spacer; and a fourth spacer formed in direct contact with the first and second portions of the third spacer, wherein a sum of thicknesses, along horizontal directions, of the second and fourth spacers over a sum of thicknesses, along the horizontal directions, of the first and third spacers is in a range between 2 and 12.

15. The memory device of claim 9, wherein the topmost surface of the vertical portion of the third spacer is below a topmost surface of the second spacer.

16. The memory device of claim 14, wherein the first spacer is a single continuous structure without an internal interface.

17. The memory device of claim 16, wherein the gate structure has a first height measured at the sidewall of the pair of opposing sidewalls of the gate structure and a second height measured at a center of the gate structure, wherein a ratio of the second height to the first height is greater than 0.95 and less than 1.

18. The memory device of claim 16, wherein the first spacer comprises silicon oxide.

19. The memory device of claim 16, wherein the second spacer comprises silicon nitride.

20. The memory device of claim 16, wherein the topmost surface of the second portion of the third spacer is below a topmost surface of the second spacer.

* * * * *

UNITED STATES PATENT AND TRADEMARK OFFICE
CERTIFICATE OF CORRECTION

PATENT NO. : 11,653,498 B2
APPLICATION NO. : 16/035251
DATED : May 16, 2023
INVENTOR(S) : Singh et al.

It is certified that error appears in the above-identified patent and that said Letters Patent is hereby corrected as shown below:

In the Specification

In Column 5, Line 48, delete "C/is" and insert -- $C_{gf}$ is --, therefor.

In the Claims

In Column 18, Claim 17, Line 16, delete "16," and insert -- 14, --, therefor.

In Column 18, Claim 18, Line 22, delete "16," and insert -- 14, --, therefor.

In Column 18, Claim 19, Line 24, delete "16," and insert -- 14, --, therefor.

In Column 18, Claim 20, Line 26, delete "16," and insert -- 14, --, therefor.

Signed and Sealed this
Twenty-eighth Day of November, 2023

Katherine Kelly Vidal
*Director of the United States Patent and Trademark Office*